United States Patent
Li et al.

(10) Patent No.: US 11,043,609 B2
(45) Date of Patent: Jun. 22, 2021

(54) LIGHT EMITTING DIODE AND METHOD OF MANUFACTURING THE SAME

(71) Applicant: XIAMEN SAN'AN OPTOELECTRONICS CO., LTD., Xiamen (CN)

(72) Inventors: Senlin Li, Tianjin (CN); Jingfeng Bi, Tianjin (CN); Chun-Kai Huang, Tianjin (CN); Jin Wang, Tianjin (CN); Chih-Hung Hsiao, Tianjin (CN); Chun-I Wu, Tianjin (CN); Du-Xiang Wang, Tianjin (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 42 days.

(21) Appl. No.: 16/583,773

(22) Filed: Sep. 26, 2019

(65) Prior Publication Data

US 2020/0020826 A1 Jan. 16, 2020

Related U.S. Application Data

(63) Continuation-in-part of application No. PCT/CN2018/081674, filed on Apr. 3, 2018.

(30) Foreign Application Priority Data

Jul. 31, 2017 (CN) .......................... 201710637778.7

(51) Int. Cl.
*H01L 33/06* (2010.01)
*H01L 33/50* (2010.01)
*H01L 33/26* (2010.01)

(52) U.S. Cl.
CPC .............. *H01L 33/06* (2013.01); *H01L 33/26* (2013.01)

(58) Field of Classification Search
CPC ......... H01L 33/06; H01L 33/26; H01L 33/22; H01L 33/30; H01L 33/0062; H01L 33/04; H01L 33/14; H01L 33/0095
USPC ........................................................ 257/79
See application file for complete search history.

(56) References Cited

U.S. PATENT DOCUMENTS

| | | | | |
|---|---|---|---|---|
| 2003/0027099 A1* | 2/2003 | Udagawa | ................ | H01L 33/32 433/79 |
| 2004/0173789 A1* | 9/2004 | Holonyak, Jr. | ........ | B82Y 20/00 257/14 |
| 2005/0051766 A1* | 3/2005 | Stokes | .................... | H01L 33/06 257/17 |

(Continued)

FOREIGN PATENT DOCUMENTS

CN 107394017 A 11/2017

OTHER PUBLICATIONS

Search Report issued to PCT application No. PCT/CN2018/081674 by the CNIPA dated Jun. 29, 2018.

*Primary Examiner* — Sheikh Maruf
(74) *Attorney, Agent, or Firm* — Thomas | Horstemeyer

(57) ABSTRACT

A light emitting diode includes an n-type confinement layer, a quantum well active layer formed on the n-type confinement layer, a p-type confinement layer formed on the quantum well active layer, a gallium phosphide-based quantum dot structure formed in the p-type confinement layer, and a GaP-based current spreading layer formed on the GaP-based quantum dot structure. A method of manufacturing the light emitting diode is also provided.

12 Claims, 2 Drawing Sheets

(56) References Cited

U.S. PATENT DOCUMENTS

| | | | |
|---|---|---|---|
| 2006/0071218 A1* | 4/2006 | Takeda | B82Y 20/00 257/79 |
| 2006/0163560 A1* | 7/2006 | Choi | B82Y 20/00 257/40 |
| 2007/0120141 A1* | 5/2007 | Moustakas | B82Y 20/00 257/103 |
| 2008/0006817 A1* | 1/2008 | Kawaguchi | H01L 33/34 257/14 |
| 2011/0156616 A1* | 6/2011 | Anderson | B41J 2/45 315/312 |
| 2011/0303893 A1* | 12/2011 | Wagner | H05B 33/10 257/13 |
| 2013/0126825 A1* | 5/2013 | Walter | H01L 33/06 257/13 |
| 2013/0200334 A1* | 8/2013 | Zhang | H01L 33/502 257/13 |
| 2019/0198562 A1* | 6/2019 | Schubert | H01L 27/156 |
| 2019/0198563 A1* | 6/2019 | Schubert | H01L 22/24 |

* cited by examiner

LIGHT EMITTING DIODE AND METHOD OF MANUFACTURING THE SAME

CROSS-REFERENCE TO RELATED APPLICATION

This application is a continuation-in-part of International Application No. PCT/CN2018/081674, filed on Apr. 3, 2018, which claims priority to Chinese Invention Patent Application No. 201710637778.7, filed Jul. 31, 2017.

FIELD

The disclosure relates to a light emitting diode, more particularly to a light emitting diode with a quantum dot structure and a method of manufacturing the light emitting diode.

BACKGROUND

The quaternary composition aluminum gallium indium phosphide is a semiconductor material with a direct band gap, having a light-emitting band that can cover the red to yellow or green band of visible light. Thus, light-emitting diode made from such material has received extensive attention.

A current spreading layer of a gallium arsenide-based light emitting diode made from AlGaInP is generally made from p-type gallium phosphide due to the desirable optical and electrical properties of GaP. The current spreading layer laterally spreads and then injects the current into the light-emitting region. However, GaP has a large lattice mismatch of up to 3.5% with the GaAs substrate and the AlGaInP active layer. Therefore, if the GaP-based current spreading layer is grown directly on the AlGaInP active layer through metallic organic chemical vapor deposition, a high number of dislocation defects would be produced at the junction between the two layers, resulting in a severe case of interface non-radiative recombination and affecting the luminescence and aging performances of the light emitting diode.

SUMMARY

Therefore, the object of the disclosure is to provide a light emitting diode and a method of manufacturing the same that may alleviate the drawback of the prior art.

According to an aspect of the disclosure, a light emitting diode includes an n-type confinement layer, a quantum well active layer formed on the n-type confinement layer, a p-type confinement layer formed on the quantum well active layer, a gallium phosphide-based quantum dot structure formed in the p-type confinement layer, and a GaP-based current spreading layer formed on the GaP-based quantum dot structure.

According to another aspect of the disclosure, a method of manufacturing a light emitting diode includes forming an n-type confinement layer, forming a quantum well active layer on the n-type confinement layer, forming a p-type confinement layer on the quantum well active layer, forming a GaP-based quantum dot structure in the p-type confinement layer, and forming a GaP-based current spreading layer on the GaP-based quantum dot structure and the p-type confinement layer.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
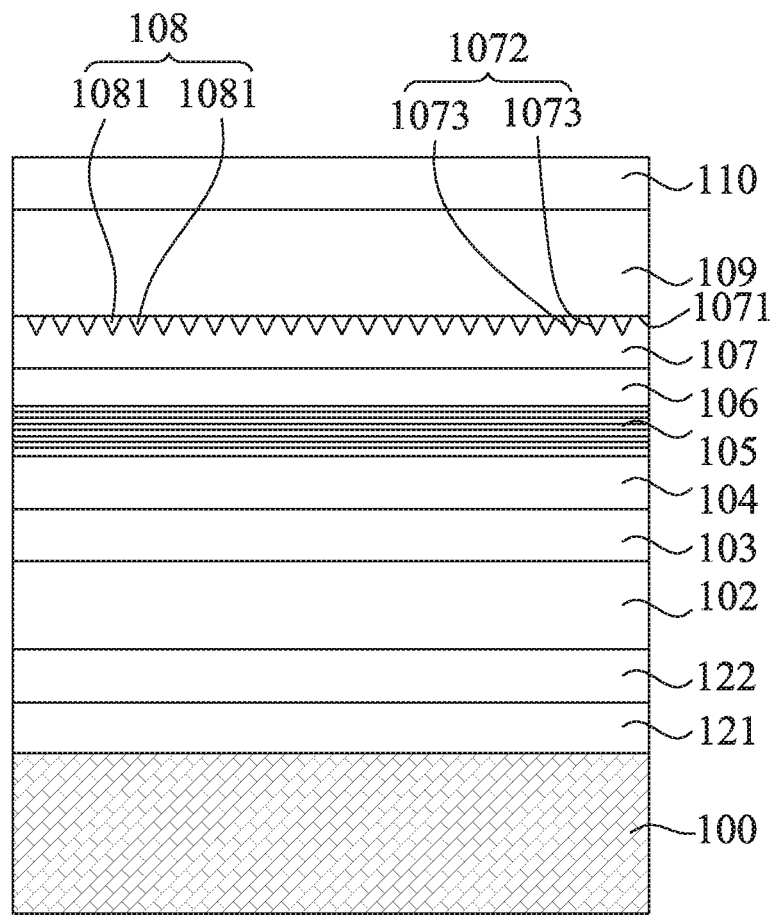
FIG. 1 is a schematic sectional view of a first embodiment of a light emitting diode according to the disclosure.
Figure 2:
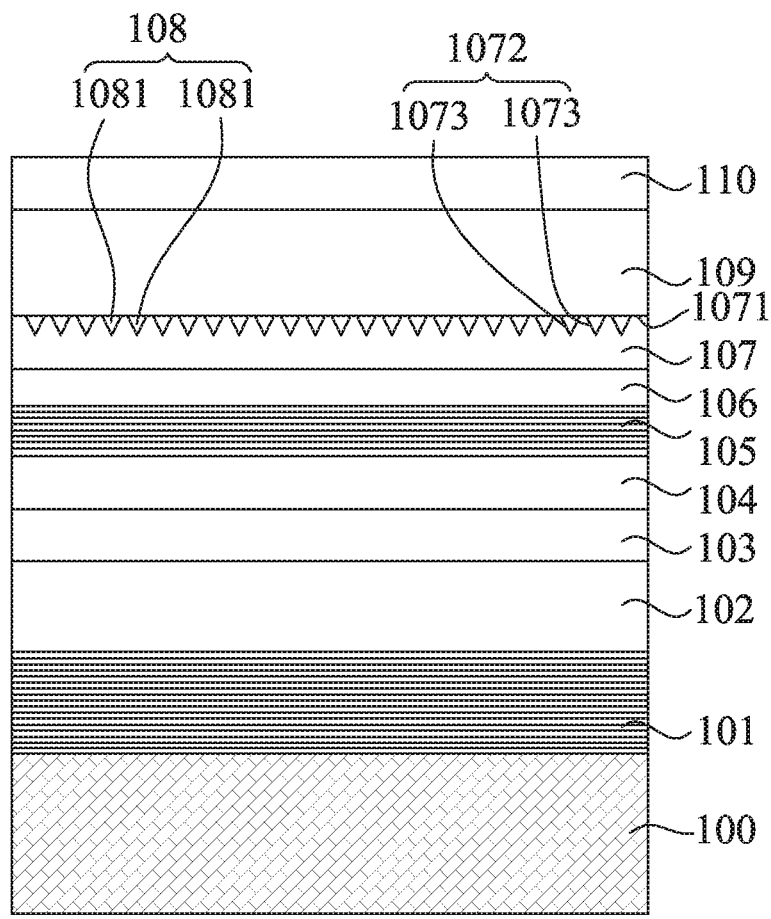
FIG. 2 is a schematic sectional view of a second embodiment of the light emitting diode according to the disclosure.

Before the present invention is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of a light emitting diode includes, in a direction of growth, a gallium arsenide-based substrate 100, an etch stop layer 121, an n-type ohmic contact layer 122, a n-type current spreading layer 102, an n-type confinement layer 103, a first intrinsic semiconductor layer 104, a quantum well active layer 105, a second intrinsic semiconductor layer 106, a p-type confinement layer 107, a gallium phosphide-based quantum dot structure 108, a GaP-based current spreading layer 109 and a p-type ohmic contact layer 110. In this embodiment, the GaP-based quantum dot structure 108 is tensile strained.

The etch stop layer 121 may be made of gallium indium phosphide, the n-type ohmic contact layer 122 may be made of GaAs, and the quantum well active layer 105 may be made of aluminum gallium indium phosphide, gallium indium phosphide, aluminum gallium arsenide, aluminum gallium indium arsenide, aluminum gallium indium arsenide phosphide, etc. Materials of the n-type and p-type confinement layer 103, 107 are selected according to the band gap of the quantum well active layer 105. If the quantum well active layer 105 emits light of wavelength which is above 670 nm, the band gap is smaller, and thus the n-type and p-type confinement layers 103, 107 may be made of aluminum gallium arsenide or aluminum gallium indium phosphide. If the quantum well active layer 105 emits light of wavelength which is below 670 nm, and more specifically below 640 nm, the band gap is larger, and thus the n-type and p-type confinement layers 103, 107 must be made with a material having larger band gap, e.g. aluminum indium phosphide having the structural formula of $Al_b In_{1-b} P$, wherein $0 < b \leq 0.5$.

The GaP-based quantum dot structure 108 is formed in the p-type confinement layer 107, located adjacent to the GaP-based current spreading layer 109, and opposite to the quantum well active layer 105. Specifically, the p-type confinement layer 107 has a top surface 1071 and a pit structure 1072 having a plurality of pits 1073 that are indented from the top surface 1071 and that have a size of between 10 nm and 50 nm, and the GaP-based quantum dot structure 108 includes a plurality of quantum dots 1081 that are respectively received in the pits 1073. The quantum dots 1081 have a density larger than $1 \times 10^8$ cm$^{-2}$ on the top surface 1071 of the p-type confinement layer 107. In this embodiment, the quantum dots 1081 are tensile strained.

A second embodiment of the light emitting diode is similar to the first embodiment, but differs from the first embodiment in that the light emitting diode includes a distributed Braggs reflector structure 101 in place of the etch stop layer 121 and the n-type ohmic contact layer 122.

A first embodiment of a method for manufacturing the first embodiment of the light emitting diode includes the following steps.

First, metallic organic chemical vapor deposition or molecular beam epitaxy is used to form a GaAs-based buffer layer on the GaAs-based substrate 100. Then the etch stop layer 121, the n-type ohmic contact layer 122, the n-type current spreading layer 102, the n-type confinement layer 103, the first space layer 104, the quantum well active layer 105, the second space layer 106, and the p-type confinement layer 107 are formed sequentially on the GaAs-based substrate 100.

Then, the pits 1073 are formed in the p-type confinement layer 107. The step of forming the plurality of pits 1073 is performed by local droplet etching technique which includes forming a plurality of separated Ga droplets on the p-type confinement layer 107 under a growth temperature by introducing a Ga-based precursor. Then, introduction of the Ga-based precursor is stopped to stop the formation of Ga droplets, followed by an in situ heating procedure to form the pits 1073. The growth temperature of the Ga droplets is larger than a melting point of Ga and a decomposition temperature of the Ga-based precursor. In this embodiment, the growth temperature of the Ga droplets is between 450° C. and 620° C., the growth rate is between 0.1 ML/s to 10 ML/s, and a density of the pits 1073 on the top surface of the p-type confinement layer 107 is larger than $1\times10^8$ cm$^2$. The heating temperature is between 450° C. and 700° C. and the heating time is between 10 s and 1000 s.

Next, the GaP-based quantum dot structure 108 is formed in the p-type confinement layer 107 and includes a plurality of the quantum dots 1081 that are respectively received in the pits 1073, and the GaP-based current spreading layer 109 is formed on the GaP-based quantum dot structure 108 and the p-type confinement layer 107. Specifically, the GaP-based quantum dot structure 108 and the GaP-based current spreading layer 109 are formed by introducing the Ga-based precursor and a P-based precursor, followed by heating. Finally, the ohmic contact layer 110 is formed on the GaP-based current spreading layer 109.

A second embodiment of the method is for manufacturing the second embodiment of the light emitting diode. In the second embodiment of the method, the distributed Braggs reflector structure 101 is formed on the substrate 100 instead of the etch stop layer 121 and the n-type ohmic contact layer 122, then the n-type confinement layer 103 and so on are formed on the DBR structure 101 as described above.

In this embodiment, after the formation of the Ga droplet and the heating process, the Ga-based precursor and the group V element precursor are introduced and a second heating is performed at a heating temperature between 450° C. and 620° C. The Ga droplet etching is terminated by the formation of Ga—P bonds between the Ga droplet and the group V element precursor. The second heating also reduces a portion of point defects of the light emitting diode. This improves the crystal quality and lowers the dislocation density of the GaP-based current spreading layer 109, improving the aging performance and electrical performance of the light emitting diode.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light emitting diode, comprising:
   an n-type confinement layer;
   a quantum well active layer formed on said n-type confinement layer;
   a p-type confinement layer formed on said quantum well active layer;
   a gallium phosphide (GaP)-based quantum dot structure formed in said p-type confinement layer; and
   a GaP-based current spreading layer formed on said GaP-based quantum dot structure.

2. The light emitting diode as claimed in claim 1, wherein said GaP-based quantum dot structure is located adjacent to said GaP-based current spreading layer and opposite to said quantum well active layer.

3. The light emitting diode as claimed in claim 2, wherein said p-type confinement layer has a top surface and a pit structure having a plurality of pits that are indented from said top surface, said GaP-based quantum dot structure including a plurality of quantum dots that are respectively received in said pits.

4. The light emitting diode as claimed in claim 1, wherein said GaP-based quantum dot structure includes a plurality of quantum dots having a density larger than $1\times10^8$ cm$^{-2}$.

5. The light emitting diode as claimed in claim 3, wherein a density of said pits of said pit structure of said p-type confinement layer is larger than $1\times10^8$ cm$^{-2}$.

6. The light emitting diode as claimed in claim 3, wherein each of said pits has a size ranging from 10 nm to 50 nm.

7. The light emitting diode as claimed in claim 1, wherein said quantum well active layer emits light having a wavelength above 670 nm, and said n-type confinement layer is made of at least one of aluminum gallium arsenide and aluminum gallium indium phosphide.

8. The light emitting diode as claimed in claim 7, wherein said p-type confinement layer is made of at least one of aluminum gallium arsenide and aluminum gallium indium phosphide.

9. The light emitting diode as claimed in claim 1, wherein said quantum well active layer emits light having a wavelength below 670 nm, and said n-type confinement layer is made of aluminum indium phosphide (AlInP).

10. The light emitting diode as claimed in claim 9, wherein said aluminum indium phosphide (AlInP) has a structural formula of $Al_bIn_{1-b}P$, wherein $0<b\leq0.5$.

11. The light emitting diode as claimed in claim 9, wherein said p-type confinement layer is made of aluminum indium phosphide (AlInP).

12. The light emitting diode as claimed in claim 11, wherein said aluminum indium phosphide (AlInP) of each of said n-type confinement layer and said p-type confinement layer has a structural formula of $Al_bIn_{1-b}P$, wherein $0<b\leq0.5$.

* * * * *